(12) United States Patent
Poon et al.

(10) Patent No.: US 9,329,492 B2
(45) Date of Patent: May 3, 2016

(54) APPARATUS AND METHOD TO CONTROL VACUUM AT POROUS MATERIAL USING MULTIPLE POROUS MATERIALS

(71) Applicant: NIKON CORPORATION, Tokyo (JP)

(72) Inventors: Alex Ka Tim Poon, San Ramon, CA (US); Leonard Wai Fung Kho, San Francisco, CA (US); Derek Coon, Redwood City, CA (US)

(73) Assignee: NIKON CORPORATION, Tokyo (JP)

( * ) Notice: Subject to any disclaimer, the term of this patent is extended or adjusted under 35 U.S.C. 154(b) by 242 days.

(21) Appl. No.: 13/929,199

(22) Filed: Jun. 27, 2013

(65) Prior Publication Data

US 2013/0286366 A1 Oct. 31, 2013

Related U.S. Application Data

(62) Division of application No. 12/573,356, filed on Oct. 5, 2009, now Pat. No. 8,477,284.

(60) Provisional application No. 61/193,019, filed on Oct. 22, 2008, provisional application No. 61/272,292, filed on Sep. 9, 2009.

(51) Int. Cl.
*G03B 27/52* (2006.01)
*G03B 27/68* (2006.01)
*G03F 7/20* (2006.01)

(52) U.S. Cl.
CPC ............ *G03F 7/70341* (2013.01); *G03B 27/52* (2013.01)

(58) Field of Classification Search
CPC ............ G03F 7/20341; G03F 7/70341; G03F 7/70858; G03F 7/70875; G03F 7/70908; G03F 7/70916; G02B 27/52
USPC ........... 355/30, 52, 53, 55, 67–71, 72–74, 77; 250/492.1, 492.2, 492.22, 493.1, 548; 430/5, 8, 22, 30, 311, 312, 321
See application file for complete search history.

(56) References Cited

U.S. PATENT DOCUMENTS 5,668,672 A 9/1997 Oomura
5,689,377 A 11/1997 Takahashi
(Continued)

FOREIGN PATENT DOCUMENTS

EP 1 628 163 A2 2/2006
EP 1 753 016 A1 2/2007
(Continued)

OTHER PUBLICATIONS

Dec. 22, 2009 International Search Report and Written Opinion in International Application No. PCT/US2009/061499.
(Continued)

*Primary Examiner* — Christina Riddle
(74) *Attorney, Agent, or Firm* — Oliff PLC

(57) ABSTRACT

An immersion liquid confinement apparatus confines an immersion liquid in an immersion area that includes a gap between a projection system and an object of exposure in an immersion lithography system. The apparatus also recovers the immersion liquid from the immersion area. The apparatus includes an aperture through which a patterned image is projected, an outlet, a first chamber into which the immersion liquid is recovered through the outlet, and a second chamber into which the immersion liquid is recovered through a porous member from the first chamber. The porous member has a first surface contacting the first chamber and a second surface contacting the second chamber. A vertical position of a first portion of the first surface is different from a vertical position of a second portion of the first surface.

16 Claims, 5 Drawing Sheets

(56) References Cited

U.S. PATENT DOCUMENTS

| | | |
|---|---|---|
| 5,835,275 A | 11/1998 | Takahashi et al. |
| 7,292,313 B2 | 11/2007 | Poon et al. |
| 7,339,650 B2 | 3/2008 | Coon et al. |
| 7,532,309 B2 | 5/2009 | Poon et al. |
| 7,576,833 B2 | 8/2009 | Poon et al. |
| 8,477,284 B2 | 7/2013 | Poon et al. |
| 2004/0160582 A1 | 8/2004 | Lof et al. |
| 2004/0207824 A1 | 10/2004 | Lof et al. |
| 2004/0257544 A1* | 12/2004 | Vogel et al. .............. 355/30 |
| 2005/0233081 A1 | 10/2005 | Tokita |
| 2006/0023182 A1 | 2/2006 | Novak et al. |
| 2006/0023187 A1 | 2/2006 | Eaton |
| 2006/0038968 A1* | 2/2006 | Kemper et al. .............. 355/18 |
| 2006/0087630 A1 | 4/2006 | Kemper et al. |
| 2006/0152697 A1* | 7/2006 | Poon et al. .............. 355/53 |
| 2007/0046910 A1 | 3/2007 | Poon et al. |
| 2007/0110213 A1 | 5/2007 | Leenders et al. |
| 2007/0222967 A1 | 9/2007 | Poon et al. |
| 2007/0252964 A1 | 11/2007 | Kohno et al. |
| 2007/0272562 A1 | 11/2007 | Noji et al. |
| 2008/0002169 A1* | 1/2008 | Hasegawa et al. .............. 355/53 |
| 2008/0018866 A1 | 1/2008 | Nagasaka et al. |
| 2008/0043211 A1 | 2/2008 | Poon et al. |
| 2008/0231822 A1 | 9/2008 | Poon et al. |
| 2008/0231823 A1 | 9/2008 | Poon et al. |
| 2009/0237631 A1 | 9/2009 | Poon et al. |
| 2009/0262318 A1 | 10/2009 | Van Den Dungen et al. |
| 2009/0268175 A1 | 10/2009 | Chibana et al. |
| 2010/0045950 A1 | 2/2010 | Kemper et al. |
| 2010/0283980 A1 | 11/2010 | Sato et al. |

FOREIGN PATENT DOCUMENTS

| | | |
|---|---|---|
| JP | A-2006-060223 | 3/2006 |
| WO | WO 2005-104195 A1 | 11/2005 |

OTHER PUBLICATIONS

Jul. 13, 2012 Office Action issued in U.S. Appl. No. 12/698,565.
Apr. 24, 2012 Office Action issued in U.S. Appl. No. 12/573,356.
Jan. 18, 2013 Notice of Allowance issued in U.S. Appl. No. 12/573,356.
May 22, 2013 Notice of Allowance issued in U.S. Appl. No. 12/573,356.
Jun. 27, 2013 Office Action issued in U.S. Appl. No. 12/698,565.
Jan. 21, 2014 Office Action issued in Japanese Patent Application No. 2011-533300 (with translation).

\* cited by examiner

APPARATUS AND METHOD TO CONTROL VACUUM AT POROUS MATERIAL USING MULTIPLE POROUS MATERIALS

CROSS-REFERENCE TO RELATED APPLICATIONS

This is a divisional of U.S. patent application Ser. No. 12/573,356 filed Oct. 5, 2009 (now U.S. Pat. No. 8,477,284), which in turn claims the benefit of U.S. Provisional Patent Application No. 61/193,019 filed Oct. 22, 2008 and of U.S. Provisional Patent Application No. 61/272,292 filed Sep. 9, 2009. The disclosure of each of the above-identified provisional and non-provisional applications is incorporated herein by reference in its entirety.

BACKGROUND

The invention relates to immersion lithography apparatus and methods, and particularly to apparatus and methods for recovering immersion fluid.

A typical lithography apparatus includes a radiation source, a projection optical system and a substrate stage to support and move a substrate to be imaged. A radiation-sensitive material, such as a resist, is coated onto the substrate surface before the substrate is placed on the substrate stage. During operation, radiation energy from the radiation source is used to project an image defined by an imaging element through the projection optical system onto the substrate. The projection optical system typically includes a plurality of lenses. The lens or optical element closest to the substrate can be referred to as the last or final optical element.

The projection area during exposure is typically much smaller than the surface of the substrate. The substrate therefore is moved relative to the projection optical system in order to pattern the entire surface of the substrate. In the semiconductor industry, two types of lithography apparatus are commonly used. With so-called "step-and-repeat" apparatus, the entire image pattern is projected at one moment in a single exposure onto a target area of the substrate. After the exposure, the substrate is moved or "stepped" in the X and/or Y direction(s) and a new target area is exposed. This step-and-repeat process is performed multiple times until the entire substrate surface is exposed. With scanning type lithography apparatus, the target area is exposed in a continuous or "scanning" motion. For example, when the image is projected by transmitting light through a reticle or mask, the reticle or mask is moved in one direction while the substrate is moved in either the same or the opposite direction during exposure of one target area. The substrate is then moved in the X and/or Y direction(s) to the next scanned target area. The process is repeated until all of the desired target areas on the substrate have been exposed.

Lithography apparatus are typically used to image or pattern semiconductor wafers and flat panel displays. The word "substrate" as used herein is intended to generically mean any workpiece that can be patterned including, but not limited to, semiconductor wafers and flat panel displays.

Immersion lithography is a technique that can enhance the resolution of lithography exposure apparatus by permitting exposure to take place with a numerical aperture (NA) that is greater than the NA that can be achieved in conventional "dry" lithography exposure apparatus having a similar optical system. By filling the space between the final optical element of the projection system and the resist-coated substrate, immersion lithography permits exposure with light that would otherwise be internally reflected at the optic-air interface. Numerical apertures as high as the index of the immersion fluid (or of the resist or lens material, whichever is least) are possible in immersion lithography systems. Liquid immersion also increases the substrate depth-of-focus, that is, the tolerable error in the vertical position of the substrate, by the index of the immersion fluid compared to a dry system having the same numerical aperture. Immersion lithography thus can provide resolution enhancement without actually decreasing the exposure light wavelength. Thus, unlike a shift in the exposure light wavelength, the use of immersion would not require the development of new light sources, optical materials (for the illumination and projection systems) or coatings, and can allow the use of the same or similar resists as conventional "dry" lithography at the same wavelength. In an immersion system in which only the final optical element of the projection system and its housing and the substrate (and perhaps portions of the stage as well) are in contact with the immersion fluid, much of the technology and design developed for dry lithography can carry over directly to immersion lithography.

However, because the substrate moves rapidly in a typical lithography system, the immersion liquid in the immersion area including the space between the projection system and the substrate tends to be carried away from the immersion area. If the immersion liquid escapes from the immersion area, that liquid can interfere with operation of other components of the lithography system. One way to recover the immersion liquid and prevent the immersion liquid from contaminating the immersion lithography system is described in US2006/0152697 A1, the disclosure of which is incorporated herein by reference in its entirety. Also see US2007/0222967 A1, the disclosure of which is incorporated herein by reference in its entirety.

The systems described in US2006/0152697 A1 and US2007/0222967 A1 include an immersion liquid confinement member. The immersion liquid confinement member includes an outlet through which immersion liquid is recovered (collected) from the immersion area. The outlet is covered by a liquid-permeable member such as a mesh or porous member. A vacuum control unit applies suction to a chamber associated with the outlet so as to draw the immersion liquid on the substrate through the liquid-permeable member and the outlet. It is important to control the suction force applied to the liquid-permeable member.

SUMMARY

In the systems described above, a lengthy pathway of liquid exists between the vacuum control system and the liquid-permeable member that is disposed to face the substrate (see, for example, FIGS. 6-9 of US2006/0152697). The length of the liquid-filled pathway may cause delays in liquid sucking when liquid on the substrate (and/or the substrate-holding table) first touches the lower surface of the liquid-permeable member. A long liquid pathway also may cause a large pressure pulse to occur at the liquid-permeable member when the flow rate in the pathway abruptly changes.

According to aspects of the invention, an immersion liquid confinement apparatus includes first and second liquid-permeable members to remove liquid from an immersion area that includes a gap between a projection system and an object (such as a substrate, a substrate holding table or both) in an immersion lithography system. The first liquid-permeable member covers an outlet in the confinement member and has a first surface that faces the object and a second surface opposite the first surface and which is in contact with a first chamber. The second liquid-permeable member is disposed in the first chamber and includes a first surface that is spaced from and opposes the second surface of the first liquid-permeable member. The second liquid-permeable member also includes a second surface opposite its first surface. The second surface of the second liquid-permeable member contacts a second chamber that is different from the first chamber.

According to preferred embodiments, first and second vacuum systems are respectively coupled to the first and second chambers. The first vacuum system, coupled to the first chamber, draws the immersion liquid from the immersion area into the first chamber through the first liquid-permeable member so that the liquid flows from the first surface of the first liquid-permeable member to the second surface of the first liquid-permeable member. Preferably, liquid is not conveyed from the first chamber to the first vacuum system. Therefore, there is no lengthy liquid pathway between the first liquid-permeable member and the first vacuum system. The second vacuum system is coupled to the second chamber and draws liquid from the first chamber through the second liquid-permeable member into the second chamber such that the liquid flows through the second liquid-permeable member from its first surface to its second surface.

The second vacuum system also draws the immersion liquid from the second chamber so that the liquid can be disposed of and/or recycled and resupplied to the immersion area through, for example, an immersion liquid supply system. Although there may be a lengthy liquid pathway between the second vacuum system and the second liquid-permeable member, because the second liquid-permeable member does not directly face the object (substrate, substrate table, etc.), the pressure fluctuation caused by the change in flow through the second liquid-permeable member would not affect the pressure in the first chamber.

According to some embodiments, a distance between the second liquid-permeable member and the first liquid-permeable member varies for different portions of the first surface of the second liquid-permeable member. For example, the first surface of the second liquid-permeable member can be convex or slanted relative to the first liquid-permeable member. This avoids the entrapment of air bubbles on the first surface of the second liquid-permeable member and more easily accommodates changes in flow rate of the collected liquid through the second liquid-permeable member.

The first and second liquid-permeable members can be a mesh or a porous member such as a sponge or a plate having holes extending through the plate.

The first and second liquid-permeable members can be identical in structure or can differ in at least one of pore size, thickness and porosity.

Other aspects of the invention relate to an immersion lithography apparatus having a projection system, a movable stage that is movable to a position below the projection system and that holds an object such as a substrate, and a confinement member according to aspects of the invention.

Other aspects of the invention relate to methods of manufacturing devices using the immersion lithography apparatus.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
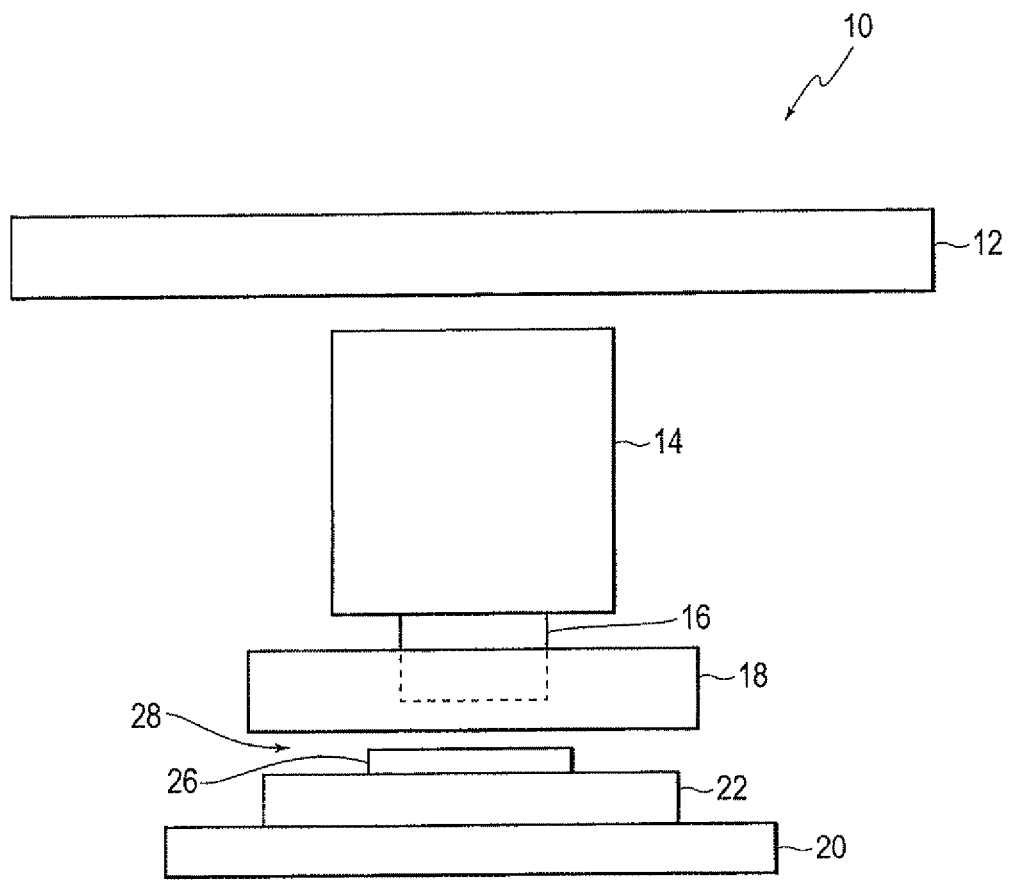
FIG. 1 is a simplified elevational view schematically illustrating an immersion lithography system according to some embodiments of the invention.

FIG. 1 shows an immersion lithography system 10 including a reticle stage 12 on which a reticle is supported, a projection system 14 having a last or "final" optical element 16, and a fine-movement stage 22 on which a substrate 26 is supported, which in turn is movable over a coarse-movement stage 20. An immersion liquid supply and recovery apparatus 18, which is sometimes referred to herein as a liquid confinement member 18, is disposed around the final optical element 16 of the projection system 14 so as to supply and recover an immersion fluid, which may be a liquid such as, for example, water, to/from a gap 28 between the final optical element 16 and the substrate 26. In the present embodiment, the immersion lithography system 10 is a scanning lithography system in which the reticle and the substrate 26 are moved synchronously in respective scanning directions during a scanning exposure operation. The fine-movement stage 22 controls the position of the substrate 26 in one or more (preferably all) of the X, Y, Z, θX, θY and θZ directions with a higher degree of precision than the coarse-movement stage 20, which is primarily used for moving the substrate 26 over longer distances, as is well known in the art. The upper surface of the fine movement stage 22 includes a substrate holder that preferably has a recess that holds the substrate 26. In addition, a portion of the upper surface of the fine movement stage 22 that surrounds the held substrate has an upper surface that is substantially level with the upper surface of the held substrate so that when the immersion area is located near the edge of the substrate, liquid is still maintained between the liquid confinement member 18 and the upper surfaces of the substrate 26 and of the substrate holder.

The illumination source of the lithography system can be a light source such as, for example, a mercury g-line source (436 nm) or i-line source (365 nm), a KrF excimer laser (248 nm), an ArF excimer laser (193 nm) or a $F_2$ laser (157 nm). The projection system 14 projects and/or focuses the light passing through the reticle onto the substrate 26. Depending upon the design of the exposure apparatus, the projection system 14 can magnify or reduce the image illuminated on the reticle. It also could be a 1× magnification system.

When far ultraviolet radiation such as from the excimer laser is used, glass materials such as silica glass and calcium fluoride that transmit far ultraviolet rays can be used in the projection system 14. The projection system 14 can be catadioptric, completely refractive or completely reflective.

With an exposure device, use of the catadioptric type optical system can be considered. Examples of the catadioptric type of optical system are shown in U.S. Pat. No. 5,668,672 and U.S. Pat. No. 5,835,275. In these cases, the reflecting optical device can be a catadioptric optical system incorporating a beam splitter and concave mirror. U.S. Pat. No. 5,689,377 also uses a reflective-refracting type of optical system incorporating a concave mirror, etc., but without a beam splitter, and also can be employed with this invention. The disclosures of the above-mentioned U.S. patents are incorporated herein by reference in their entireties.

Figure 2:
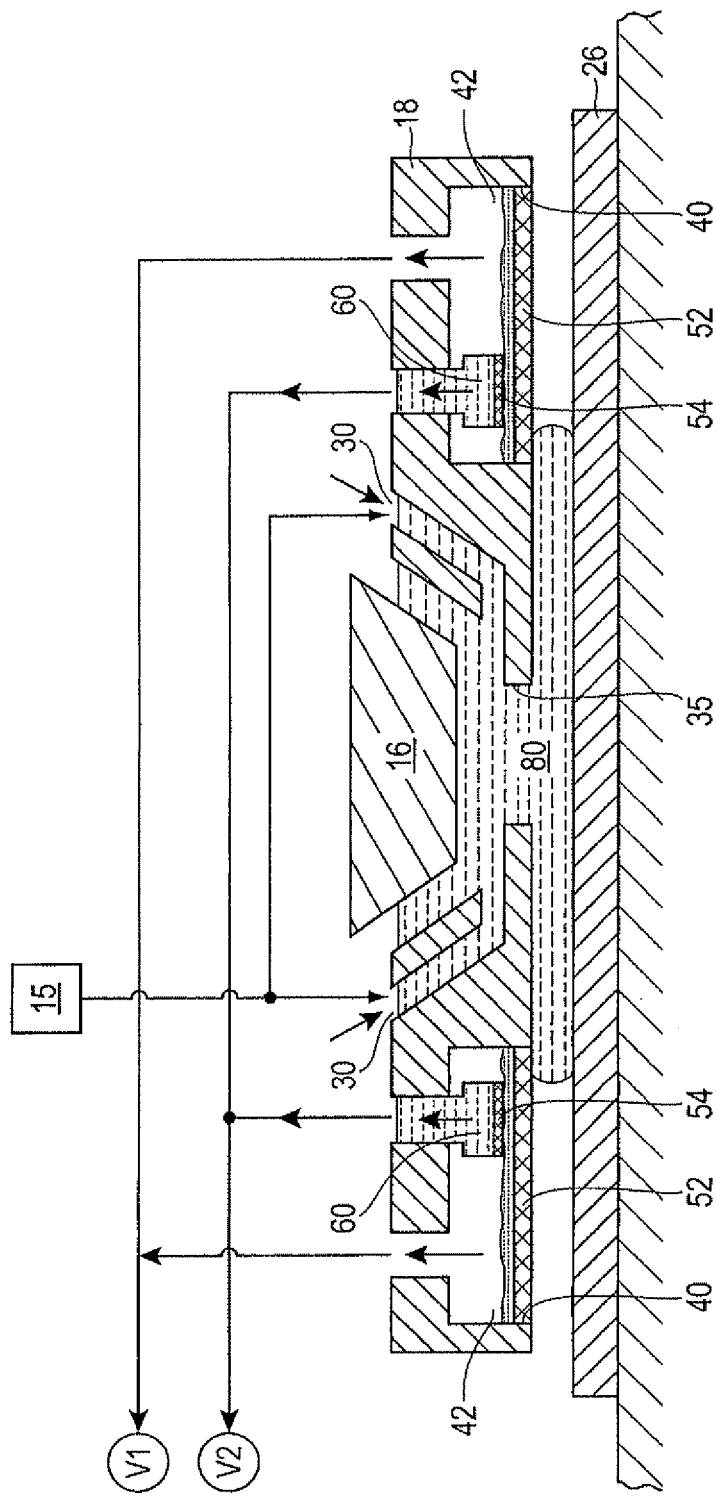
FIG. 2 is a simplified side cross-sectional view of a liquid confinement member and its fluid removal system according to a first embodiment of the invention.

FIG. 2 is a cross-section view of an embodiment of a liquid confinement member 18. As shown in FIG. 2, the liquid confinement member 18 maintains immersion liquid 80 in an immersion area, which includes the gap or space between the final optical element 16 of the projection system 14 and a portion of the upper surface of the substrate 26. The immersion liquid 80 in FIG. 2 can be seen as occupying only a portion of the upper surface of the substrate 26. That is, the size of the immersion area is smaller than the size of the upper surface of the substrate 26 such that only part of the upper surface of the substrate is covered. Depending on the relative position of the substrate 26 with respect to the projection system 14 (and the liquid confinement member 18) the immersion area can be disposed over the substrate, over a portion of the substrate and a portion of the substrate holder that surrounds the substrate, or over only a portion of the substrate holder (for example, when the substrate is moved such that it no longer is disposed below the projection system 14). In addition, if the exposure apparatus includes a measurement stage that is used to take measurements regarding the projection system 14, the immersion area can be formed between an upper surface of the measurement stage and the final optical element 16 (there would be no substrate holder on the measurement stage).

The liquid confinement member 18 includes at least one (and preferably more than one) liquid supply inlets 30 through which the immersion liquid 80 is supplied to the immersion area. The liquid is supplied to the supply inlets 30 through a supply path, one end of which is connected to a liquid supply 15 and the other end of which is connected to an inlet manifold of the liquid confinement member 18. The liquid supplied to the supply inlets 30 reaches the substrate 26 after passing through aperture 35 disposed centrally in the confinement member 18. As shown in FIG. 2, the supply and recovery of the immersion liquid is controlled so that the level of the immersion liquid between the liquid confinement member 18 and the final optical element 16 is maintained above the lower surface of the final optical element 16 so that the exposure light transmitted through the projection system 14 travels only through the immersion liquid (that is, exposure light does not travel through any air or gas) before reaching the substrate 26.

In the FIG. 2 embodiment, the liquid confinement member 18 includes an outlet 40. In the FIG. 2 embodiment, the outlet 40 is an annular groove that surrounds aperture 35, and thus also surrounds the immersion area. Liquid is removed from the immersion area and from the surface of the substrate 26 (and/or the surface of the substrate holder) via the outlet 40. The outlet 40 is covered by a first liquid-permeable member 52 such that a first chamber 42 is disposed at least partially within the liquid confinement member 18. A first (lower) surface of the first liquid-permeable member 52 faces toward the substrate 26, whereas a second (upper) surface of the first liquid-permeable member 52 contacts the chamber 42. Liquid that passes through the first liquid-permeable member 52 from its first surface to its second surface thus enters the first chamber 42.

Although the outlet 40 (and thus also the first liquid-permeable member 52) is a continuous groove in FIG. 2, the outlet 40 (and thus the first liquid-permeable member 52 covering the outlet) could be a series of arc-shaped portions, straight portions or angled portions that collectively surround the immersion area and communicate with first chamber 42. Furthermore, the outlet could be circular in plan view, rectangular or any other shape in plan view.

A second liquid-permeable member 54 is disposed within first chamber 42 and includes a first (lower) surface that is spaced from and faces the second (upper) surface of the first liquid-permeable member 52. The second liquid-permeable member 54 also includes a second (upper) surface opposite its first surface and that contacts a second chamber 60. The second chamber 60 thus is defined by the second liquid-permeable member 54 and walls or other structure.

The first chamber 42 communicates with a first vacuum system V1 that applies a suction force to the first chamber 42. The suction force is sufficient to draw immersion liquid through the first liquid-permeable member 52 into the first chamber 42. The first vacuum system V1 is controlled so that the suction force applied to the first liquid-permeable member 52 is maintained below the bubble point of the first liquid-permeable member 52. That is, the first vacuum system V1 controls a pressure in the first chamber 42 such that substantially only liquid is removed from the immersion area and/or from the surface of the substrate 26 (and/or the surface of the substrate holder) through the first liquid-permeable member 52, but not gas from the surface of the substrate 26 (and/or the surface of the substrate holder). However, the first vacuum system V1 does not cause the liquid to be removed from first chamber 42.

Rather, a second vacuum system V2 that communicates with the second chamber 60 causes liquid within the first chamber 42 to be drawn through the second liquid-permeable member 54 into the second chamber 60. The liquid within the second chamber 60 is then removed from the second chamber 60 via the suction force caused by second vacuum system V2. The second vacuum system V2 is controlled so that the suction force applied to the second liquid-permeable member 54 is maintained below the bubble point of the second liquid-permeable member 54. That is, the second vacuum system V2 controls a pressure in the second chamber 60 such that substantially only liquid is removed from the first chamber 42 through the second liquid-permeable member 54, but not gas from the first chamber 42. The vacuum systems V1 and V2 can be systems for controlling a vacuum force as described, for example, in US2006/0152697 A1 and US2007/0222967 A1, the disclosures of which are incorporated herein by reference in their entireties.

The manner in which the liquid confinement member 18 is controlled to remove liquid now will be described.

For context, a system such as the system described in US2006/0152697 A1 will be described. The system of US2006/0152697 A1 is similar to what is shown in FIG. 2 of the present application except that there is no second chamber 60, second liquid-permeable member 54 or second vacuum control system V2. The system of US2006/0152697 A1 simply draws immersion liquid through a single liquid-permeable member such as the first liquid-permeable member 54 shown in Applicants' FIG. 2. The liquid fills a single chamber, such as first chamber 42, and the liquid is drawn from chamber 42 by a single vacuum system such as system V1 of Applicants' FIG. 2. Accordingly, there is a lengthy liquid pathway between the vacuum system and the liquid-permeable member that faces the substrate. Therefore, as mentioned earlier, when liquid initially contacts the lower surface of the liquid-permeable member, there is a delay in the recovery of that liquid due to the time required to accelerate the liquid in the lengthy liquid pathway. In addition, the long liquid pathway causes a large pressure pulse to occur when the flow rate in the pathway changes abruptly, which occurs, for example, when exposure begins and ends for each substrate and when rapid movements of the substrate occur, for example, between the exposure of different shot areas on the substrate. Accordingly, to avoid exceeding the bubble point at the liquid-permeable member, the suction force provided by the vacuum control system typically is reduced substantially below the suction force that would exceed the bubble point of the liquid-permeable member. Thus, even when there are pressure pulses, the vacuum force will not exceed the bubble point of the liquid-permeable member. Reducing the suction force, however, further reduces the responsiveness of the liquid recovery system, for example, when liquid initially touches the liquid-permeable member. This can cause liquid to escape from below the liquid confinement member. Reducing the suction force also reduces the maximum flow rate by which the liquid can be collected. For example, in a system where the bubble point of the liquid-permeable member is 2 KPascal, the vacuum control system may be controlled so that the steady state suction force applied to the liquid-permeable member is about 1 KPascal.

In the system described in Applicants' FIG. 2, a suction force much closer to the bubble point of the first liquid-permeable member can be applied to the first-liquid permeable member by first vacuum control system V1 because there is a very short liquid path above the first liquid-permeable member 52 in the first chamber 42. In particular, the length of the liquid path is approximately equal to the distance between the lower surface of the second liquid-permeable member 54 and the upper surface of the first liquid-permeable member 52. This distance can be as small as 3 mm.

Because there is a short liquid path formed above the first liquid-permeable member 52, there is substantially no delay in liquid sucking when liquid first touches the lower surface of the first liquid-permeable member 52. Furthermore, the short liquid pathway formed above the first liquid-permeable member 52 will not cause large pressure pulse to occur when the flow rate in that pathway changes abruptly. Accordingly, the first vacuum control system V1 can be controlled so as to apply a suction force to the first liquid-permeable member that is very close to the bubble point of the first liquid-permeable member 52. Thus, the conditions occurring at the first liquid-permeable member 52 are very stable regardless of the rate of liquid flow through the first liquid-permeable member 52.

The control of flow through the second liquid-permeable member 54 is similar to what was described above with respect to the control of flow through a system having a single liquid-permeable member. In particular, the suction force applied by second vacuum control system V2 to the second liquid-permeable member 54 maintains the suction force at the second liquid-permeable member 54 far enough below the bubble point of the second liquid-permeable member 54 so that large pressure pulses that may occur at the second liquid-permeable member 54 when there are abrupt changes in liquid flow do not exceed the bubble point of the second liquid-permeable member 54. When there are large changes in flow, however, the excess liquid, which cannot initially be drawn fast enough through the second liquid-permeable member 54 is accommodated within the first chamber 42 (that is, the liquid level within first chamber 42 will rise when there is a sudden increase in flow through the first liquid-permeable member 52). However, once that surge in flow reduces and the flow through the second liquid-permeable member 54 reaches a more steady state, the level of liquid within the first chamber 42 will gradually decrease until it reaches the steady condition shown in FIG. 2.

Although the second liquid-permeable member 54 in FIG. 2 is shown as arranged substantially horizontal, it is preferable that the second liquid-permeable member 54 be arranged so that it is not horizontal along its entire surface because air bubbles may get trapped under the lower surface of a flat horizontal member 54 when the liquid flow is low. Accordingly, alternative embodiments shown in FIGS. 3 and 4 provide a second liquid-permeable member in which a distance between the lower surface of the second liquid-permeable member and the upper surface of the first liquid-permeable member varies for different portions of the second liquid-permeable member.

Figure 3:
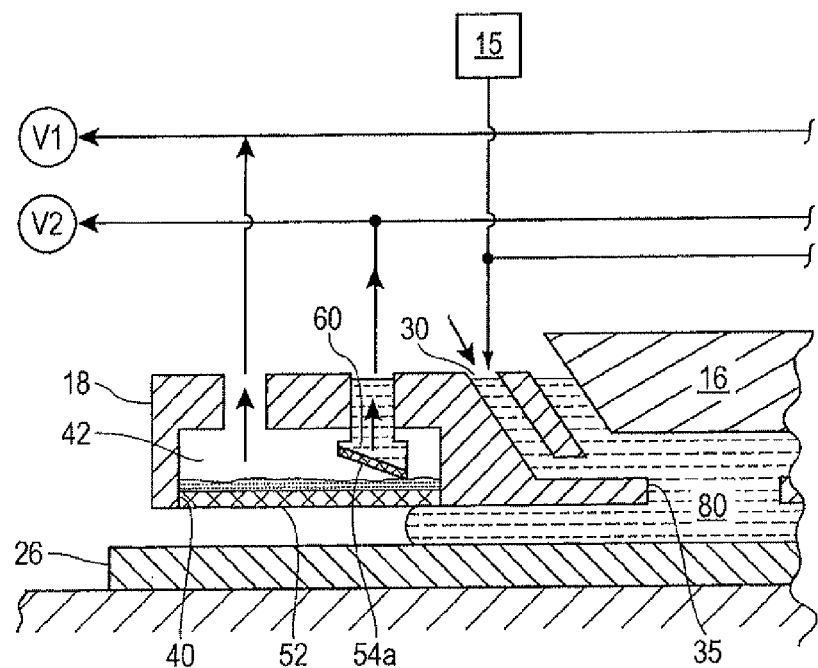
FIG. 3 is a simplified side cross-sectional view of a liquid confinement member and its fluid removal system according to a second embodiment of the invention.

FIG. 3 shows an embodiment in which the second liquid-permeable member 54a is slanted so that one portion of it is closer to the first liquid-permeable member 52 than is another portion of the second liquid-permeable member 54a.

Figure 4:
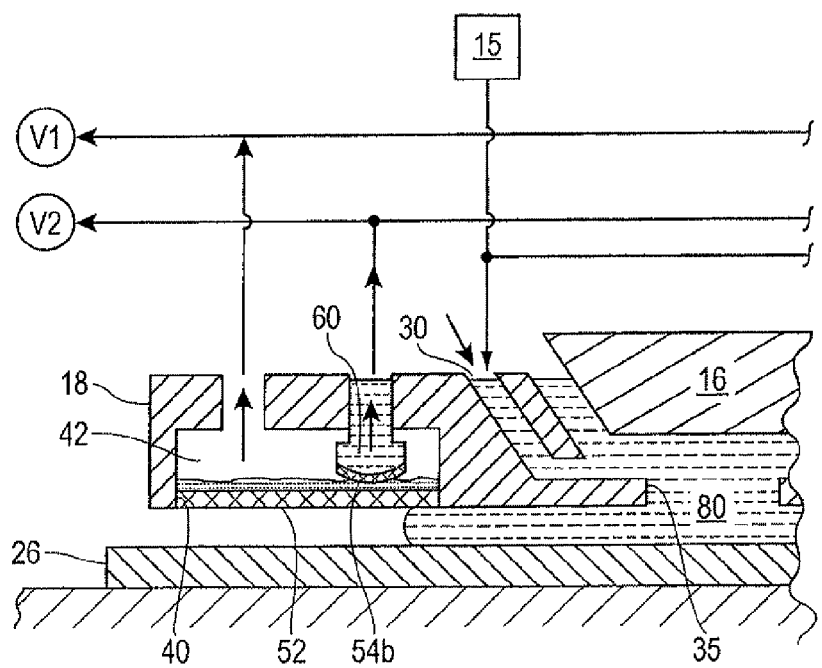
FIG. 4 is a simplified side cross-sectional view of a liquid confinement member and its fluid removal system according to a third embodiment of the invention.

FIG. 4 shows an embodiment in which the second liquid-permeable member 54b is convex so that different portions of it are spaced different distances from the first liquid-permeable member 52.

The embodiments of FIGS. 3 and 4 also are advantageous in that they can more readily accommodate changes in flow through the first liquid-permeable member 52 because, as the flow rate increases, more area of the second liquid-permeable member 54a or 54b will come into contact with the liquid in chamber 42, thereby increasing the flow rate capacity through the second liquid-permeable member 54a/54b.

In certain embodiments, the immersion fluid is a liquid having a high index of refraction. In different embodiments, the liquid may be pure water, or a liquid including, but not limited to, cedar oil, fluorin-based oils, "Decalin" or "Perhydropyrene."

The first liquid-permeable member 52, or the second liquid-permeable member 54, or both of the first and second liquid-permeable members may be a porous member such as a mesh or may be formed of a porous material having holes typically with a size smaller than 150 μm. For example, the porous member may be a wire mesh including woven pieces or layers of material made of metal, plastic or the like, a porous metal, a porous glass, a porous plastic, a porous ceramic, a sponge or a sheet of material having chemically etched holes (for example, by photo-etching). The first and second liquid-permeable members could be identical in structure or could differ in one or more of pore size, thickness and porosity. In certain embodiments, the first vacuum system V1 may be controlled so that the suction force applied to the first liquid-permeable member 52 is maintained at or above the bubble point of the first liquid-permeable member 52. That is, the first vacuum system V1 may control a pressure in the first chamber 42 such that a mixture of liquid and gas is removed from the immersion area and/or from the surface of the substrate 26 (and/or the surface of the substrate holder) through the first liquid-permeable member 52. In certain embodiments, the second vacuum system V2 may be controlled so that the suction force applied to the second liquid-permeable member 54 is maintained at or above the bubble point of the second liquid-permeable member 54. That is, the second vacuum system V2 may control a pressure in the second chamber 60 such that a mixture of liquid and gas is removed from the first chamber 42 through the second liquid-permeable member 54.

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate, or a photolithography system for manufacturing a thin film magnetic head.

Figure 5:
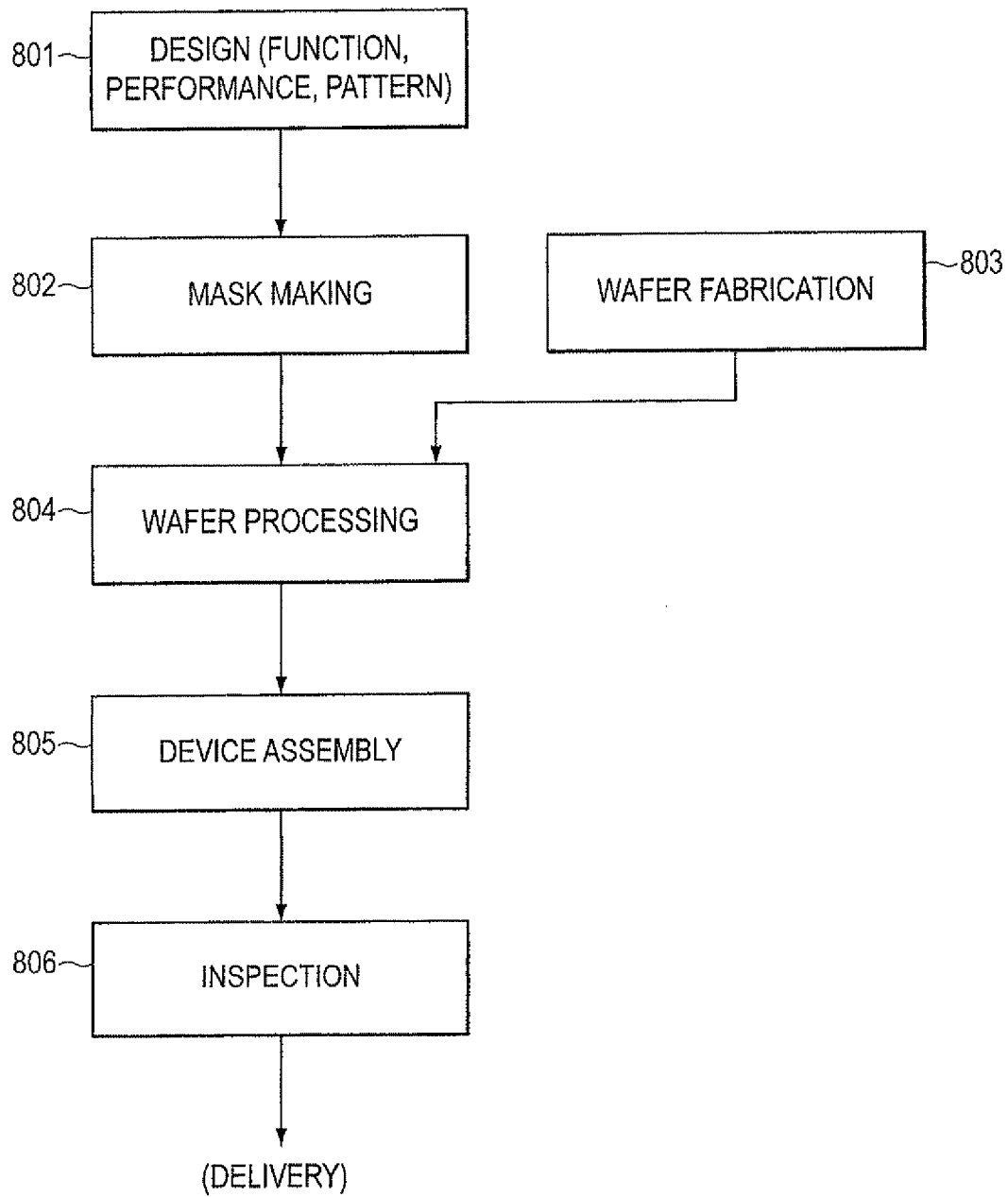
FIG. 5 is a flowchart that outlines a process for manufacturing a device in accordance with the invention.

Semiconductor devices can be fabricated using the above described systems, by the process shown generally in FIG. 5. In step 801 the device's function and performance characteristics are designed. Next, in step 802, a mask (reticle) having a pattern is designed according to the previous designing step, and in a step 803, a wafer is made from a silicon material. The mask pattern designed in step 802 is exposed onto the wafer from step 803 in step 804 by a photolithography system described hereinabove in accordance with aspects of the invention. In step 805, the semiconductor device is assembled (including the dicing process, bonding process and packaging process). Finally, the device is then inspected in step 806.

Figure 6:
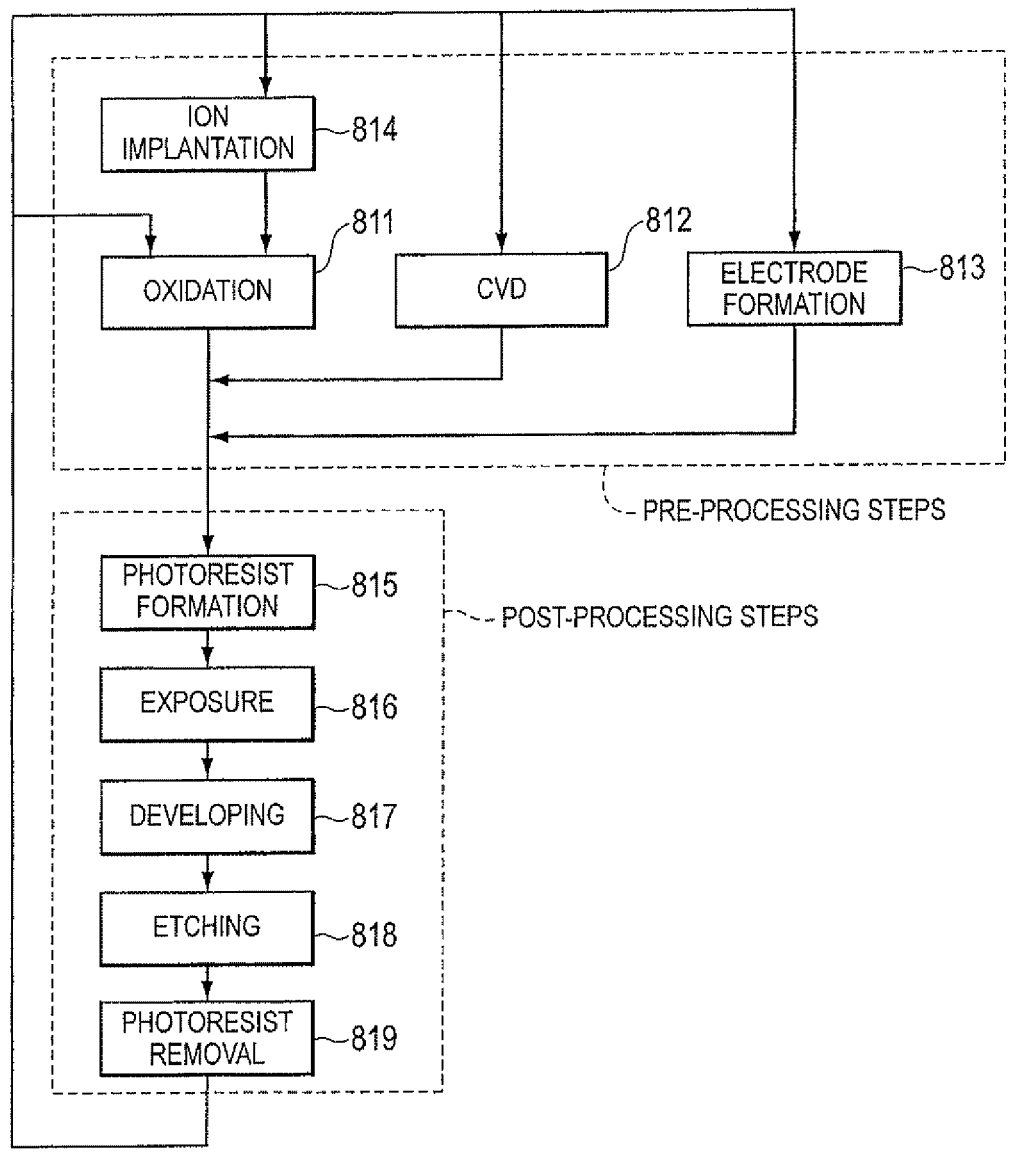
FIG. 6 is a flowchart that outlines device processing in more detail.

FIG. 6 illustrates a detailed flowchart example of the above-mentioned step 804 in the case of fabricating semiconductor devices. In FIG. 6, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An immersion liquid confinement apparatus for confining an immersion liquid in an immersion area that includes a gap between a projection system and an object in an immersion lithography system, the apparatus also recovering the immersion liquid from the immersion area, the apparatus comprising:
    an aperture through which a patterned image is projected;
    an outlet that faces downwardly so that the outlet faces the object, the outlet located radially outward of an outer circumference of the aperture relative to an optical axis of the projection system;
    a first chamber into which the immersion liquid is recovered through the outlet; and
    a second chamber into which the immersion liquid is recovered through a porous member from the first chamber,
    wherein:
    the porous member has a first surface contacting the first chamber and a second surface contacting the second chamber, and
    a vertical position of a first portion of the first surface is different from a vertical position of a second portion of the first surface.

2. The apparatus of claim 1, wherein the first surface of the porous member is convex.

3. The apparatus of claim 1, wherein the first surface of the porous member is slanted.

4. The apparatus of claim 1, wherein the porous member is a mesh.

5. The apparatus of claim 1, wherein the porous member is a sponge.

6. The apparatus of claim 1, wherein the porous member is a plate having holes extending through the plate.

7. The apparatus of claim 1, wherein a mixture of the immersion liquid and a gas is removed from the immersion area into the first chamber.

8. The apparatus of claim 1, wherein a mixture of the immersion liquid and a gas is removed from the first chamber through the porous member.

9. An immersion lithography apparatus comprising:
    a projection system having a final optical element;
    a movable stage that is movable to a position below the projection system such that a gap exists between the final optical element and a surface of the stage; and
    the immersion liquid confinement apparatus of claim 1.

10. An immersion liquid confinement apparatus for confining an immersion liquid in an immersion area that includes a gap between a projection system and an object in an immersion lithography system, the apparatus also recovering the immersion liquid from the immersion area, the apparatus comprising:
    a body;
    an aperture provided on the body and through which a patterned image is projected;
    an outlet provided on the body;
    a first chamber provided in the body and into which the immersion liquid is recovered through the outlet; and
    a second chamber provided in the body and into which substantially only the immersion liquid is recovered from the first chamber,
    wherein:

the outlet is covered with a porous member through which the immersion liquid is removed from the immersion area into the first chamber.

11. The apparatus of claim 10, wherein the porous member is a mesh.

12. The apparatus of claim 10, wherein the porous member is a sponge.

13. The apparatus of claim 10, wherein the porous member is a plate having holes extending through the plate.

14. The apparatus of claim 10, wherein a mixture of the immersion liquid and a gas is removed from the immersion area through the porous member.

15. An immersion lithography apparatus comprising:
a projection system having a final optical element;
a movable stage that is movable to a position below the projection system such that a gap exists between the final optical element and a surface of the stage; and
the immersion liquid confinement apparatus of claim 10.

16. An immersion liquid confinement apparatus for confining an immersion liquid in an immersion area that includes a gap between a projection system and an object in an immersion lithography system, the apparatus also recovering the immersion liquid from the immersion area, the apparatus comprising:
an aperture through which a patterned image is projected;
an outlet;
a first chamber into which the immersion liquid is recovered through the outlet; and
a second chamber into which substantially only the immersion liquid is recovered from the first chamber, a part of the second chamber protruding into the first chamber, wherein:
the outlet is covered with a porous member through which the immersion liquid is removed from the immersion area into the first chamber.

* * * * *